United States Patent [19]
Ueta et al.

[11] 4,322,777
[45] Mar. 30, 1982

[54] CIRCUIT BOARD FORMED WITH SPARK GAP

[75] Inventors: Yasuomi Ueta, Yokohama; Tatsuro Toyama, Kanagawa, both of Japan

[73] Assignee: Hitachi, Ltd., Tokyo, Japan

[21] Appl. No.: 131,771

[22] Filed: Mar. 19, 1980

[30] Foreign Application Priority Data

Mar. 26, 1979 [JP] Japan .................................. 54-34420

[51] Int. Cl.³ ............................................. H05K 1/18
[52] U.S. Cl. .................................. 361/397; 174/68.5; 313/325; 361/212
[58] Field of Search ............... 174/68.5; 361/397, 212, 361/117, 406; 313/325

[56] References Cited

U.S. PATENT DOCUMENTS

| 2,421,248 | 5/1947 | Forest | 313/325 X |
| 3,045,143 | 7/1962 | Schickel | 313/325 |
| 3,303,393 | 2/1967 | Hymes | 174/68.5 X |
| 3,480,836 | 11/1969 | Aronstein | 174/68.5 X |
| 3,766,308 | 10/1973 | Loro | 174/68.5 |

FOREIGN PATENT DOCUMENTS 2229301  1/1974  Fed. Rep. of Germany ..... 174/68.5

OTHER PUBLICATIONS

Aubin et al., Aluminum and Lead-Tin Terminal for Integrated Circuits, IBM Tech. Dis. Bull., vol. 17 #1, Jun. 1974, p. 108.
Hafner et al., Tinning Metal Pads on a Nonwettable Substrate, IBM Tech. Dis. Bull., vol. 19 #1, Jun. 1976, p. 140.

Primary Examiner—Richard R. Kucia
Attorney, Agent, or Firm—Craig and Antonelli

[57] ABSTRACT

A circuit board formed with a spark gap for protecting a circuit element such as a transistor connected to a picture tube of a television receiver when spark discharge occurring within the picture tube produces a current under a high voltage tending to destroy the transistor. The spark gap comprises a pair of metal balls disposed respectively on the confronting tip portions of a pair of discharge electrodes disposed opposite to each other on an insulator substrate so that spark discharge can always occur across these metal balls without occurring across the electrodes.

7 Claims, 24 Drawing Figures

CIRCUIT BOARD FORMED WITH SPARK GAP

This invention relates to a spark gap device, and more particularly to a circuit board formed with a spark gap suitable to be included in a circuit which is connected to a picture tube of a television receiver and which is in the form of a thick-film circuit module.

It is known that, in a picture tube of a television receiver, spark discharge tends to frequently occur across the anode of the picture tube and one of various terminals and electrodes, for exmaple, the cathode of the picture tube due to a potential difference applied there across owing to the presence of glass powders, impurities, dust and any other foreign matters remaining within the picture tube. This discharge phenomenon is commonly called "internal discharge." As a result of occurrence of such spark discharge within the picture tube, current under a high voltage will be supplied from the anode of the picture tube to the electrode, for example, the cathode at which the spark discharge has occurred, and a circuit element such as a transistor will be thereby destroyed when the transistor is connected to the electrode at which the spark discharge has occurred. To protect such a transistor against damage, therefore, it has been a prior art practice to connect a spark gap to the electrode such as the cathode at which the spark discharge tends to frequently occur, so that current under a high voltage induced by the discharge can flow toward this spark gap without flowing through the transistor. However, the prior art spark gap has been defective in that, when the energy of the spark discharge is excessively large, undesirable burnout tends to occur at the confronting tip portions of the electrodes of the spark gap due to the concentration of the energy of the spark discharge on the tip portions of these electrodes, thereby increasing the distance between the electrodes of the spark gap, with the result that the discharge starting voltage becomes higher than the predetermined setting until finally the spark gap is unable to maintain its primary function of preventing damage to the circuit element.

With a view to obviate the prior art defect pointed out above, it is a primary object of the present invention to provide a circuit board formed with a spark gap which is free from undesirable burnout of its electrode tip protons even in the event of occurrence of a spark discharge of excessively large energy and which is capable of maintaining its discharge starting voltage at the predetermined setting over an extended period of time of use.

The spark gap formed on the circuit board according to the present invention comprises a pair of balls made of a metal disposed on the confronting tip portions of a pair of opposite electrodes respectively so that spark discharge can occur across these two metal balls. It is apparent that the metal balls used in the spark gap according to the present invention are not subject to burnout even in the event of occurrence of spark discharge of excessively large energy and are made of a suitable metal, for example, copper.

The electric resistance of copper is low, and, therefore, the balls of copper do not generate any appreciable heat even when current flows therethrough as a result of spark discharge. The heat conductivity of copper is high. Therefore, generated heat is immediately dissipated from the balls of copper without causing an appreciable temperature rise even when heat may be generated therein. Further, due to the fact that the melting point of copper is higher than that of materials such as a solder and an electrode material of silver (Ag)-palladium (Pd) system, the balls of copper would not be easily fused or burnt out.

In accordance with the present invention, there is provided a circuit board formed with a spark gap comprising a substrate made of an electrical insulator, a pair of a first electrode and a second electrode disposed opposite to each other on the insulator substrate in a relation spaced apart by a predetermined distance, and a pair of a first metal ball and a second metal ball disposed on the confronting tip portions of the first ans second electrodes respectively, the shortest distance between the first metal ball and the second metal ball being selected to be smaller than the distance between the first electrode and the second electrode.

The background of the present invention and preferred embodiments of the present invevtion will be described with reference to the accompanying drawings, in which.

For a better understanding of the present invention, the prior art will be described with reference to FIGS. 1A and 1B before describing preferred embodiments of the present invention in detail.

Figure 1A:
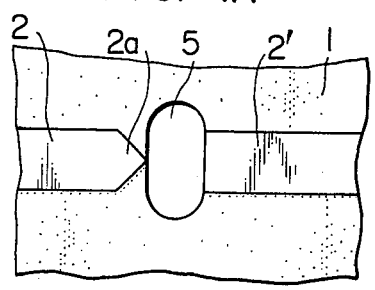
FIGS. 1A and 1B are a schematic plan view and a schematic sectional view respectively of a prior art spark gap formed as a part of a thick-film module circuit.
Figure 1B:
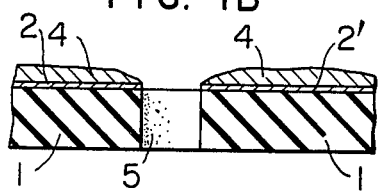

Referring to FIGS. 1A and 1B which are a schematic plan view and a schematic sectional view respectively of a prior art spark gap in a thick-film module circuit, the spark gap has such a construction that a slit 5 is bored in a substrate 1 of an electrical insulator such as alumina, and an electrode material of, for example, Ag (silver)-Pd (palladium) system is selectively printed or evaporated on opposite sides of this slit 5 to form a pair of opposite discharge electrodes 2 and 2'. A layer of solder 4 may be deposited by fusion on each of these electrodes 2 and 2' as required. The tip portion 2a of one of the electrodes or the electrode 2 is shaped in the form of a triangle so that, when spark discharge occurs, a spark jumps always from the triangular tip portion 2a of the electrode 2 thereby stabilizing the spark discharge.

However, in the event of occurrence of spark discharge of excessively large energy across this prior art spark gap, the energy of discharge will be concentrated on the tip portion 2a of the electrode 2, and consequent burnout of this tip portion 2a will give rise to an increase in the distance between the electrodes 2 and 2'. The prior art spark gap is defective in that the discharge starting voltage becomes higher than the predetermined setting due to the increased distance between the electrodes 2 and 2' until finally the primary function of the spark gap cannot be maintained or is utterly lost. The slit 5 is provided for the purpose of electrical insulation between the electrodes 2 and 2' until spark discharge starts to occur there across. It is another function of this slit 5 to prevent undesirable lowering of the discharge starting voltage due to the presence of matters produced during spark discharge and deposited on the insulator substrate 1 since, in the absence of this slit 5, spark discharge will occur through the matters deposited on the insulator substrate 1.

Figure 2A:
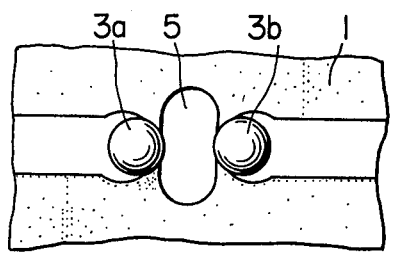
FIGS. 2A and 2B are a schematic plan view and a schematic sectional view respectively of a first embodiment of the spark gap formed on the circuit board according to the present invention.
Figure 2B:
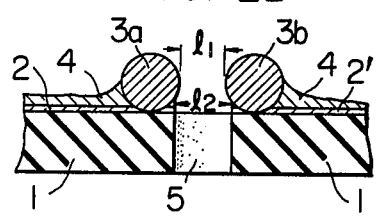

Preferred embodiments of the present invention will now be described in detail. FIGS. 2A and 2B show a first embodiment of the spark gap formed on the circuit board according to the present invention and are a schematic plan view and a schematic sectional view respectively. In the first embodiment shown in FIGS. 2A and 2B, an electrode material of, for example, Ag-Pd system is selectively printed on a substrate 1 of an electrical insulator such as alumina or forsterite in the first step thereby forming a pair of opposite discharge electrodes 2 and 2'. A layer of printing solder 4 is then printed on each of the electrodes 2 and 2', and a pair of balls 3a and 3b of a metal such as copper are then placed on the solder layers 4 on opposite sides of a slit 5 bored in the insulator substrate 1. Subsequently, heat is applied to the insulator substrate 1 to fuse the solder 4 thereby electrically connecting the metal balls 3a and 3b to the electrodes 2 and 2' respectively by the solder 4. In the above arrangement, the shortest distance $l_1$ between the metal ball 3a and the metal ball 3b is selected to be smaller than the distance $l_2$ between the electrode 2 and the electrode 2'. This is because spark discharge occurs necessarily across the metal balls 3a and 3b without occurring across the electrodes 2 and 2' when the distance $l_1$ is smaller than the distance $l_2$. The metal balls 3a and 3b would not be easily burnt out as described hereinbefore, and, therefore, a spark gap capable of sufficiently withstanding the large energy of spark discharge can be provided.

The metal balls 3a and 3b have preferably a completely spherical surface as illustrated in FIGS. 2A and 2B showing the first embodiment. Presence of a rugged or projecting portion on the surface of the metal balls 3a and 3b will result in burnout of the projecting portion as in the case of the prior art spark gap, and the discharge starting voltage will become correspondingly higher.

Figure 3:
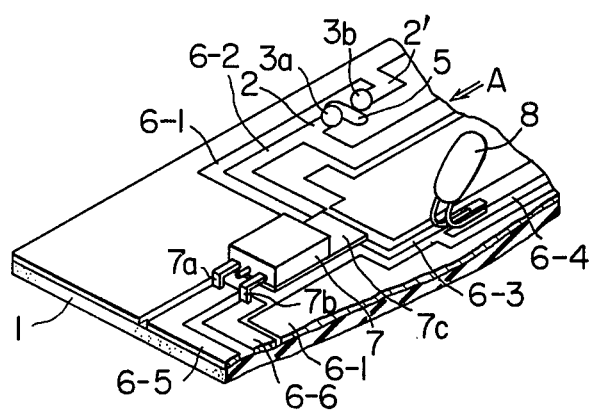
FIG. 3 is a schematic perspective view of a part of a thick-film module circuit including therein the spark gap according to the present invention.

FIG. 3 is a schematic perspective view of a part of a thick-film module circuit formed on the substrate provided with the spark gap according to the present invention. This thick-film module circuit includes a grounding conductor 6-1, a conductor 6-2 connected to the collector 7c of a transistor 7, a conductor 6-3 connecting the collector 7c of the transistor 7 to one of the terminals of a capacitor 8, a conductor 6-4 connected to the other terminal of the capacitor 8, a conductor 6-5 connected to the base 7a of the transistor 7, and a conductor 6-6 connected to the emitter 7b of the transistor 7. These conductors are deposited on the insulator substrate 1, and one of the electrodes or the electrode 2 of the spark gap is connected to the conductor 6-2, while the other electrode 2' of the spark gap is connected to the grounding conductor 6-1.

When spark discharge occurs within the picture tube and a voltage produced by the spark discharge is applied to the conductor 6-2 in a direction as, for example, shown by the arrow A in the circuit shown in FIG. 3, spark discharge occurs across the metal balls 3a and 3b, and current flows form the conductor 6-2 to the grounding conductor 6-1 via the electrode 2, metal balls 3a, 3b and electrode 2' to establish a short-circuit connection between the conductor 6-2 and the conductor 6-1. Consequently, no current flows toward the base 7a and emitter 7b of the transistor 7 from its collector 7c although the transistor 7 is connected at its collector 7c to the conductor 6-2, and the transistor 7 is protected against damage.

In the thick-film module circuit shown in FIG. 3, the width of the conductor 6-2 is about 0.5 mm, the diameter of the metal balls 3a and 3b is about 1.0 mm, the shortest distance $l_1$ between the metal balls 3a and 3b is about 0.5 mm, and the discharge starting voltage of the spark gap is selected to be about 2.5 kV to 3.0 kV.

Figure 4A:
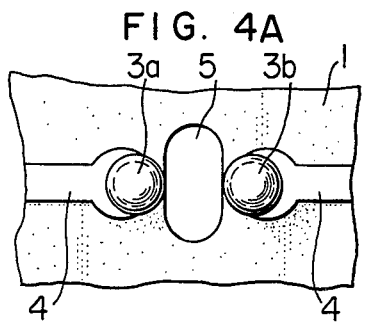
FIGS. 4A and 4B are a schematic plan view and a schematic sectional view respectively of a second embodiment of the spark gap formed on the circuit board according to the present invention.
Figure 4B:
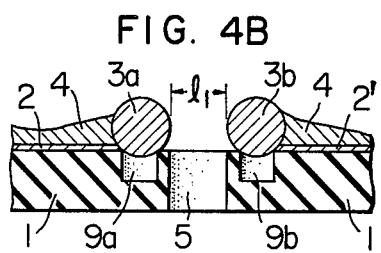

FIGS. 4A and 4B show a second embodiment of the spark gap formed on the circuit board according to the present invention and are a schematic plan view and a schematic sectional view respectively. In this second embodiment which is a modification of the first embodiment shown in FIGS. 2A and 2B, a pair of spaced recesses 9a and 9b having a diameter smaller than that of the metal balls 3a and 3b are provided in the insulator substrate 1, so that the metal balls 3a and 3b can be accurately positioned by these recesses 9a and 9b respectively. The spark gap can thus operate with good performance without any substantial fluctuation in its discharge starting voltage, since the distance $l_1$ between the metal balls 3a and 3b can be accurately set at the designed value in this second embodiment.

Figure 5A:
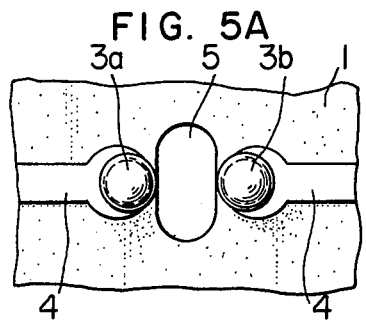
FIGS. 5A and 5B are a schematic plan view and a schematic sectional view respectively of a third embodiment of the spark gap formed on the circuit board according to the present invention.
Figure 5B:
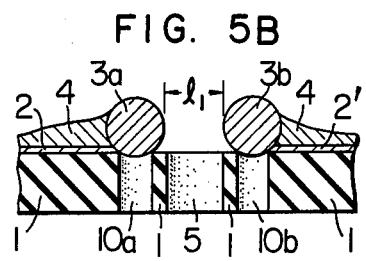

FIGS. 5A and 5B show a third embodiment of the spark gap formed on the circuit board according to the present invention and are a schematic plan view and a shematic sectional view respectively. In this third embodiment which is a modification of the second embodiment shown in FIGS. 4A and 4B, the recesses 9a and 9b are replaced by a pair of spaced holes 10a and 10b respectively extending through the insulator substrate 1.

In this third embodiment too, the distance $l_1$ between the metal balls 3a and 3b can be accurately set at the designed value, and the advantage of the spark gap is entirely similar to that of the second embodiment in that it can operate without any substantial fluctuation in its discharge starting voltage.

Figure 6A:
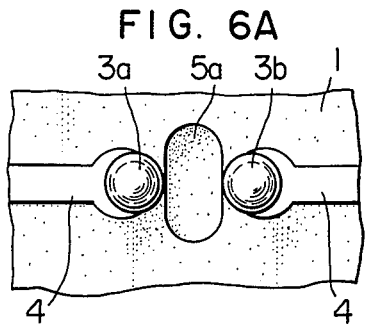
FIGS. 6A and 6B are a schematic plan view and a schematic sectional view respectively of a fourth embodiment of the spark gap formed on the circuit board according to the present invention.
Figure 7A:
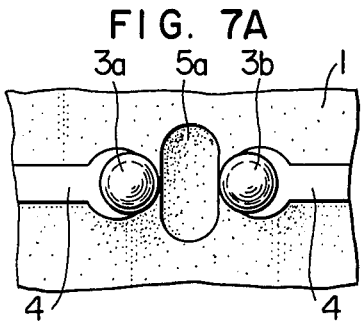
FIGS. 7A and 7B are a schematic plan view and a schematic sectional view respectively of a fifth embodiment of the spark gap formed on the circuit board according to the present invention.
Figure 6B:
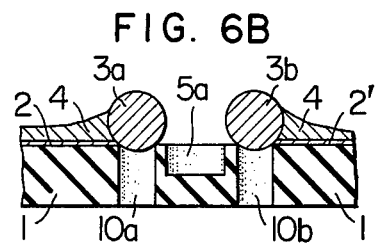
Figure 7B:
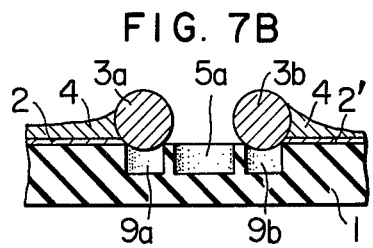
Figure 8A:
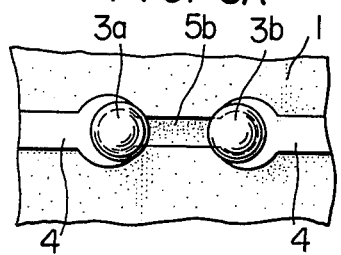
FIGS. 8A and 8B are a schematic plan view and a schematic sectional view respectively of a sixth embodiment of the spark gap formed on the circuit board according to the present invention.
Figure 9A:
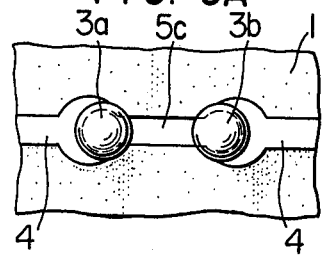
FIGS. 9A and 9B are a schematic plan view and a schematic sectional view respectively of a seventh embodiment of the spark gap formed on the circuit board according to the present invention.
Figure 8B:
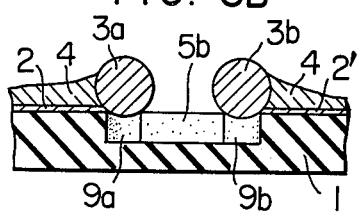
Figure 9B:
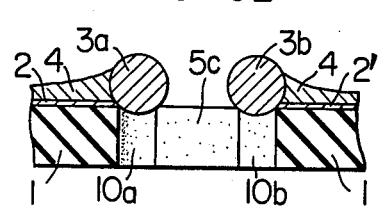

FIGS. 6A and 6B, FIGS. 7A and 7B, FIGS. 8A and 8B, and FIGS. 9A and 9B show a fourth embodiment, a fifth embodiment, a sixth embodiment and a seventh embodiment of the present invention respectively. The fourth embodiment shown in FIGS. 6A and 6B is a modification of the third embodiment shown in FIGS. 5A and 5B, and the slit 5 in FIGS. 5A and 5B is replaced by a recess 5a. The fifth embodiment shown in FIGS. 7A and 7B is a modification of the fourth embodiment shown in FIGS. 6A and 6B, and the holes 10a and 10b in FIGS. 6A and 6B are replaced by a pair of spaced recesses 9a and 9b respectively. The sixth embodiment shown in FIGS. 8A and 8B is a modification of the fifth embodiment shown in FIGS. 7A and 7B, and the recess 5a is replaced by a recess 5b which communicates with the recesses 9a and 9b. The seventh embodiment shown in FIGS. 9A and 9B is a modification of the sixth embodiment shown in FIGS. 8A and 8B, and the recesses 9a, 9b and 5b in FIGS. 8A and 8B are replaced by holes 10a, 10b and a slit 5c respectively extending through the insulator substrate 1. In any one of the fourth, fifth, sixth and seventh embodiments described above, the distance $l_1$ between the metal balls 3a and 3b can be accurately set at the designed value as in the second and third embodiments, so that undesirable fluctuation in the discharge starting voltage of the spark gap can be similarly effectively minimized. The function of the recess 5a or 5b or the slit 5c is substantially similar to that of the slit 5.

Figure 10A:
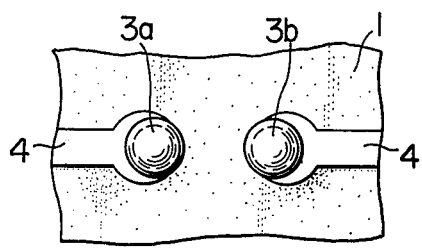
FIGS. 10A and 10B are a schematic plan view and a schematic sectional view respectively of an eighth embodiment of the spark gap formed on the circuit board according to the present invention.
Figure 10B:
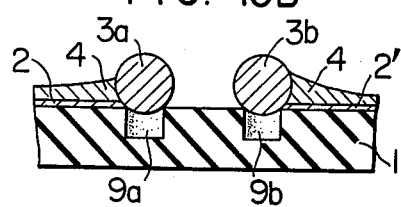
Figure 11A:
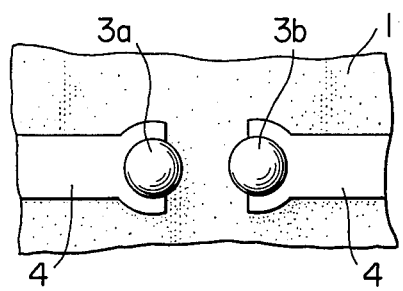
FIGS. 11A and 11B are a schematic plan view and a schematic sectional view respectively of a ninth embodiment of the spark gap formed on the circuit board according to the present invention.
Figure 11B:
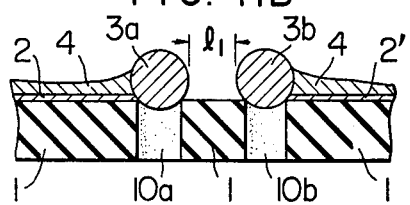

FIGS. 10A and 10B show an eighth embodiment of the present invention, and FIGS. 11A and 11A show a ninth embodiment of the present invention. The eighth embodiment shown in FIGS. 10A and 10B is a modification of the fifth embodiment shown in FIGS. 7A and 7B in that the recess 5a formed in the portion of the insulator substrate 1 between the metal balls 3a and 3b in FIGS. 7A and 7B is eliminated, and the holes 9a and 9b for positioning the respective metal balls 3a and 3b are only provided. The ninth embodiment shown in FIGS. 11A and 11B is a modification of the seventh embodiment shown in FIGS. 9A and 9B in that the slit 5c formed in the portion of the insulator substrate 1 between the metal balls 3a and 3b in FIGS. 9A and 9B is eliminated and the holes 10a and 10b for positioning the respective metal balls 3a and 3b are only provided. In the eighth and ninth embodiments too, the distance $l_1$ between the metal balls 3a and 3b can be accurately set at the designed value, and undesirable fluctuation in the discharge starting voltage of the spark gap can be minimized. In the prior art spark gap shown in FIGS. 1A and 1B, the slit 5 is absolutely required because, in the absence of this slit 5, matters produced as a result of spark discharge will deposit on the insulator substrate 1, and spark discharge tends to occur through the matters deposited on the insulator substrate 1 thereby lowering the discharge starting voltage level. In the case of the spark gap according to the present invention, a spark jumps always across the metal balls 3a and 3b at the positions closest to each other, that is, along the path of the shortest distance $l_1$ between the metal balls 3a and 3b, and this path is spaced from the insulator substrate 1 by a distance which is enough to prevent deposition or accumulation of such matters on the insulator substrate 1. Thus, in the eighth and ninth embodiments too in which the slit 5 is eliminated, the spark gap according to the present invention can operate with designed performance while maintaining constant its discharge starting voltage over an extended period of time of use.

Figure 12A:
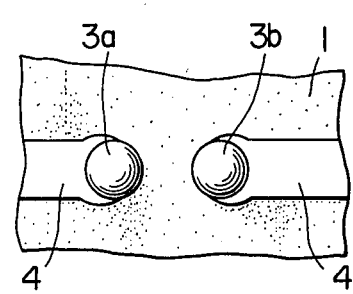
FIGS. 12A and 12B are a schematic plan view and a schematic sectional view respectively of a tenth embodiment of the spark gap formed on the circuit board according to the present invention.
Figure 12B:
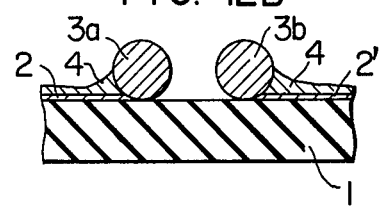
Figure 13:
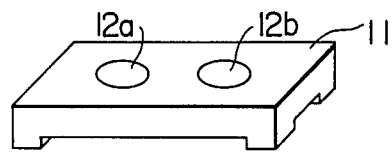
FIG. 13 is a schematic perspective view of a holder used for positioning the metal balls.

FIGS. 12A and 12B show a tenth embodiment of the circuit board formed with the spark gap according to the present invention and are a schematic plan view and a schematic sectional view respectively. In this tenth embodiment, the insulator substrate 1 is not provided with any one of the slit recesses and holes. Without the provision of the recesses or holes, it is difficult to accurately position the metal balls 3a and 3b in the relation spaced apart by the predetermined shortest distance $l_1$. In this embodiment, therefore, a ball holder 11 as shown in FIG. 13 is employed for the positioning purpose. Referring to FIG. 13, this ball holder 11 is formed with a spaced pair of holes or recesses 12a and 12b adapted to receive the metal balls 3a and 3b therein respectively so that the metal balls 3a and 3b can be accurately positioned by the ball holder 11 in the relation spaced apart by the predetermined shortest distance $l_1$. This ball holder 11 may be employed to hold the balls 3a and 3b in the first embodiment of the present invention shown in FIGS. 2A and 2B.

It will be understood from the foregoing detailed description that the spark gap according to the present invention comprises a pair of metal balls dispsed on the confronting tip portions of a pair of spaced electrodes respectively so that spark discharge can occur across these metal balls without occuring across the electrodes. Therefore, even when spark discharge of excessively large energy may occur, the electrodes are free from burnout, and the discharge starting voltage can be maintained at the predetermined setting over an extended period of time of use, so that a circuit element such as a transistor can be reliably protected against damage.

What is claimed is:

1. A circuit board formed with a spark gap comprising:

a substrate made of an electrical insulator;

a first electrode disposed on said insulator substrate and having a tip portion;

a second electrode disposed opposite to said first electrode on said insulator substrate and having a tip portion spaced apart by a predetermined first distance from the tip portion of said first electrode;

a first metal ball electrically connected to said first electrode and disposed on the tip portion of said first electrode at a precise position so as to be spaced apart by a second distance which is shorter than said first distance from the tip portion of said second electrode;

first positioning means formed on the position of said insulator substrate on which said first metal ball is disposed for holding said first metal ball at the precise position;

a second metal ball electrically connected to said second electrode and disposed on the tip portion of said second electrode at a precise position so as to be spaced apart by a third distance which is shorter than said first distance from the tip portion of said first electrode; and second positioning means formed on the position of said insulator substrate on which said second metal ball is disposed for holding said second metal ball at the precise position.

2. A circuit board formed with a spark gap comprising:
- a substrate made of an electrical insulator in which there are provided first and second spaced recesses disposed adjacent to each other and spaced apart by a predetermined first distance;
- a first metal ball, the diameter of which is larger than that of a first spaced recess formed in said insulator substrate, and which is disposed on said first spaced recess;
- a second metal ball, the diameter of which is larger than that of a second spaced recess formed in said insulator substrate, and which is disposed on said second spaced recess;
- a first electrode, which is disposed in proximity to said first spaced recess on said insulator substrate and is spaced apart by a second distance which is longer than said first distance from said second spaced recess, and which is electrically connected to said first metal ball; and
- a second electrode, which is disposed in proximity to said second spaced recess on said insulator substrate and is spaced apart by a third distance which is longer than said first distance from said first spaced recess, and which is electrically connected to said second metal ball.

3. A circuit board formed with a spark gap according to claim 2, wherein there is further provided a third spaced recess in said insulator substrate in the portion between said first and second spaced recesses.

4. A circuit board formed with a spark gap according to claim 2, wherein a slit extends through said insulator substrate in the portion between said first and second spaced recesses.

5. A circuit board formed with a spark gap comprising:
- a substrate made of an electrical insulator in which there are provided first and second holes spaced apart by a predetermined first distance;
- a first metal ball, the diameter of which is larger than that of said first hole formed in said insulator substrate, and which is disposed on said second hole;
- a first electrode, which is disposed in proximity to said first hole on said insulator substrate and is spaced apart by a second distance which is longer than said first distance from said second hole, and which is electrically connected to said first metal ball; and
- a second electrode which is disposed in proximity to said second hole on said insulator substrate and is spaced apart by a third distance which is longer than said first distance from said first hole, and which is electrically connected to said second metal ball.

6. A circuit board formed with a spark gap according to claim 5, wherein there is further provided a spaced recess in said insulator substrate in the portion between said first and second holes.

7. A circuit board formed with a spark gap according to claim 5, wherein a slit extends through said insulator substrate in the portion between said first and second holes.

* * * * *